(12) United States Patent
Xiao et al.

(10) Patent No.: US 12,317,472 B2
(45) Date of Patent: May 27, 2025

(54) METHOD FOR MANUFACTURING SEMICONDUCTOR DEVICE, SEMICONDUCTOR DEVICE, AND STACK DEVICE

(71) Applicants: CHANGXIN MEMORY TECHNOLOGIES, INC., Hefei (CN); BEIJING SUPERSTRING ACADEMY OF MEMORY TECHNOLOGY, BeiJing (CN)

(72) Inventors: Deyuan Xiao, Hefei (CN); Yong Yu, Hefei (CN); Guangsu Shao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 484 days.

(21) Appl. No.: 17/931,888

(22) Filed: Sep. 13, 2022

(65) Prior Publication Data
US 2023/0363136 A1    Nov. 9, 2023

Related U.S. Application Data

(63) Continuation of application No. PCT/CN2022/094423, filed on May 23, 2022.

(30) Foreign Application Priority Data

May 6, 2022    (CN) .......................... 202210486361.6

(51) Int. Cl.
    *H10B 12/00*    (2023.01)

(52) U.S. Cl.
    CPC ........... *H10B 12/05* (2023.02); *H10B 12/033* (2023.02); *H10B 12/315* (2023.02)

(58) Field of Classification Search
    None
    See application file for complete search history.

(56) References Cited

U.S. PATENT DOCUMENTS

| 11,600,726 | B2 * | 3/2023 | Han | ................... | H10B 12/0335 |
| 2013/0161731 | A1 * | 6/2013 | Bin | ...................... | H10D 30/693 |
| | | | | | 438/269 |

(Continued)

FOREIGN PATENT DOCUMENTS

| CN | 109285836 A | 1/2019 |
| CN | 112913027 A | 6/2021 |

(Continued)

*Primary Examiner* — Steven M Page
(74) *Attorney, Agent, or Firm* — Syncoda LLC; Feng Ma

(57) ABSTRACT

A method for manufacturing a semiconductor device includes the following operations. A substrate is provided. Bit lines extending in a first direction are formed on the substrate. A first dielectric layer is formed on the bit lines. The first dielectric layer is etched from top to bottom to form channel holes in the first dielectric layer, in which the channel holes expose the bit lines. A channel layer is formed in each channel hole, in which the channel layer includes a first source/drain area, a channel area and a second source/drain area which are arranged from bottom to top, the first source/drain area is electrically connected to a respective one bit line. Word lines extending in a second direction are formed in the first dielectric layer.

8 Claims, 14 Drawing Sheets

(56) References Cited

U.S. PATENT DOCUMENTS

| | | | |
|---|---|---|---|
| 2013/0234242 A1* | 9/2013 | Hwang | H10D 84/0165 |
| | | | 438/270 |
| 2014/0110781 A1 | 4/2014 | Hwang | |
| 2015/0079744 A1 | 3/2015 | Hwang | |
| 2019/0027492 A1* | 1/2019 | Lee | H10B 43/10 |
| 2019/0074363 A1* | 3/2019 | Zhu | H10D 30/63 |
| 2019/0296155 A1 | 9/2019 | Sawabe et al. | |
| 2020/0111918 A1 | 4/2020 | Karda et al. | |
| 2021/0335789 A1* | 10/2021 | Zhu | H10D 30/6728 |
| 2022/0102352 A1 | 3/2022 | Lee et al. | |

FOREIGN PATENT DOCUMENTS

| | | |
|---|---|---|
| CN | 112956030 A | 6/2021 |
| IN | 114284269 A | 4/2022 |

* cited by examiner

METHOD FOR MANUFACTURING SEMICONDUCTOR DEVICE, SEMICONDUCTOR DEVICE, AND STACK DEVICE

CROSS-REFERENCE TO RELATED APPLICATIONS

This is a continuation application of International Patent Application No. PCT/CN2022/094423 filed on May 23, 2022, which claims priority to Chinese Patent Application No. 202210486361.6 filed on May 6, 2022. The disclosures of the above-referenced applications are hereby incorporated by reference in their entirety.

BACKGROUND

In a semiconductor device, such as a partially depleted Silicon-On-Insulator (SOI) structure, holes are likely to accumulate in a body area to generate a floating body effect, resulting in an increase in the potential of the body area. The increase in the potential of the body area will cause a threshold voltage of the semiconductor device to reduce, resulting in an increase in source-drain current, thereby generating a warping effect to affect the performance of the semiconductor device.

Therefore, the floating body effect severely affects the performance of the semiconductor device and limits the application of the semiconductor device.

SUMMARY

The disclosure relates to the field of semiconductor manufacturing, and in particular to a method for manufacturing a semiconductor device, a semiconductor device, and a stack device.

An embodiment of the disclosure provides a method for manufacturing a semiconductor device, which includes the following operations.

A substrate is provided.

A plurality of bit lines extending in a first direction are formed on the substrate.

A first dielectric layer is formed on the plurality of bit lines.

The first dielectric layer is etched from top to bottom to form a plurality of channel holes in the first dielectric layer, in which the plurality of channel holes expose the plurality of bit lines.

A channel layer is formed in each of the plurality of channel holes, in which the channel layer includes a first source/drain area, a channel area and a second source/drain area which are arranged from bottom to top, the first source/drain area is electrically connected to a respective one of the plurality of bit lines, and the first source/drain area, the channel area and the second source/drain area have a same conductive type.

A plurality of word lines extending in a second direction are formed in the first dielectric layer, in which each of the plurality of word lines is arranged around a plurality of channel areas of a plurality of channel layers.

An embodiment of the disclosure further provides a semiconductor device, which includes:
a substrate;
direction;
a plurality of bit lines arranged on the substrate and extending in a first a first dielectric layer arranged on the plurality of bit lines, in which the first dielectric layer is provided with a plurality of channel holes, and the plurality of channel holes expose the plurality of bit lines;
a plurality of channel layers, in which each of the plurality of channel layers is arranged in a respective one of the plurality of channel holes, and includes a first source/drain area, a channel area and a second source/drain area which are arranged from bottom to top, the first source/drain area is electrically connected to a respective one of the plurality of bit lines, and the first source/drain area, the channel area and the second source/drain area have a same conductive type; and
a plurality of word lines arranged in the first dielectric layer, in which the plurality of word lines extend in a second direction, and each of the plurality of word lines is arranged around a plurality of channel areas of the plurality of channel layers.

An embodiment of the disclosure further provides a stack device, which includes:
a substrate, and a plurality of storage structures arranged on the substrate and stacked onto one another.

Each of the plurality of storage structures includes:
a plurality of bit lines extending in a first direction;
a first dielectric layer arranged on the plurality of bit lines, in which the first dielectric layer is provided with a plurality of channel holes, and the plurality of channel holes expose the plurality of bit lines;
a plurality of channel layers, in which each of the plurality of channel layers is arranged in a respective one of the plurality of channel holes, and includes a first source/drain area, a channel area and a second source/drain area which are arranged from bottom to top, the first source/drain area is electrically connected to a respective one of the plurality of bit lines, and the first source/drain area, the channel area and the second source/drain area have a same conductive type;
a plurality of word lines arranged in the first dielectric layer, in which the plurality of word lines extend in a second direction, and each of the plurality of word lines is arranged around a plurality of channel areas of the plurality of channel layers; and
a capacitor structure electrically connected to the second source/drain area.

The details of one or more embodiments of the disclosure are set forth in the accompanying drawings and the description below. Other features and advantages of the disclosure will be apparent from the description, the accompanying drawings and the claims.

BRIEF DESCRIPTION OF THE DRAWINGS

In order to describe the technical solutions in the embodiments of the disclosure more clearly, the accompanying drawings required to be used in the embodiments of the disclosure will be simply introduced below. Apparently, the accompanying drawings in the following description show merely some embodiments of the disclosure, and persons of ordinary skill in the art may still derive other drawings from these accompanying drawings without any creative effort.

DETAILED DESCRIPTION

Figure 1:
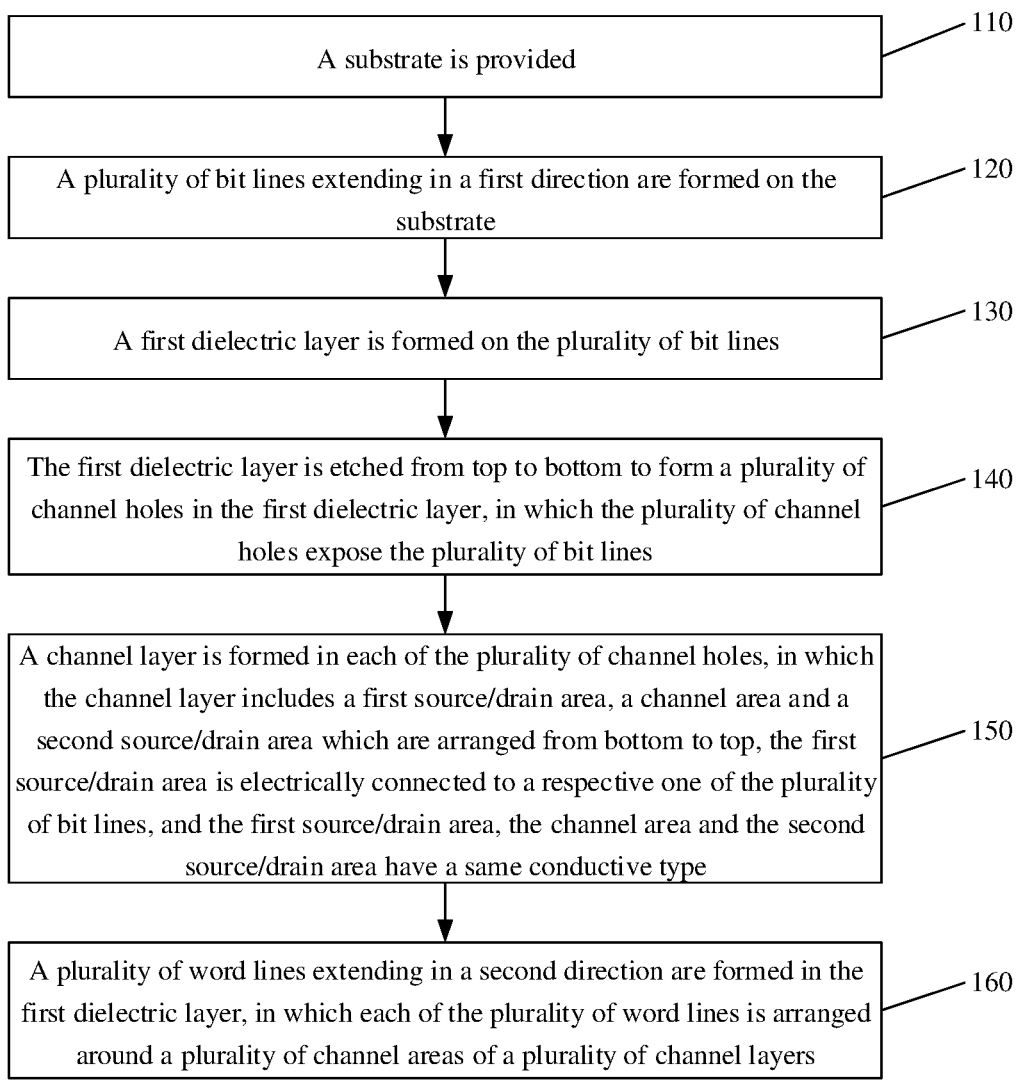
FIG. 1 is a flowchart of a method for manufacturing a semiconductor device according to an embodiment of the disclosure.

Exemplary embodiments of the disclosure will be described in more detail below with reference to accompanying drawings. Although the exemplary embodiments of the disclosure are shown in the accompanying drawings, it should be understood that the disclosure may be implemented in various forms and cannot be limited by the specific embodiments described herein. On the contrary, these embodiments are provided to more thoroughly understand the disclosure and to completely convey the scope of the disclosure to those skilled in the art.

In the following description, numerous specific details are set forth in order to provide a more thorough understanding of the disclosure. However, it will be apparent to those skilled in the art that the disclosure may be implemented without one or more of these details. In other examples, in order to avoid confusion with the disclosure, some technical features known in the art are not described. That is, all the features of the actual embodiments are not described here, and the well-known functions and structures are not described in detail.

In the accompanying drawings, the sizes and relative size of layers, regions, and elements may be exaggerated for clarity. The same reference numerals denote the same element throughout the disclosure.

It should be understood that, when an element or layer is described as being "on", "adjacent to", "connected to" or "coupled to" another element or layer, it may be directly on, adjacent to, connected to, or coupled to the other element or layer, or there can be an intermediate element or layer. In contrast, when an element is described as being "directly on", "directly adjacent to", "directly connected to" or "directly coupled to" another element or layer, there is no intermediate element or layer. It should be understood that although the terms "first", "second", "third" and the like may be used to describe various elements, components, regions, layers and/or portions, these elements, components, regions, layers and/or portions should not be limited by these terms. These terms are only used to distinguish an element, component, region, layer or portion from another element, component, region, layer or portion. Therefore, a first element, component, region, layer or portion discussed below may be described as a second element, component, region, layer or portion without departing from the teachings of the disclosure. When the second element, component, region, layer or portion is discussed, it does not mean that the first element, component, region, layer or portion is necessarily present in the disclosure.

Spatial relation terms, such as "below", "under", "lower", "beneath", "above", and "on" may be used herein for convenience of description to describe a relationship between an element or feature and another element or feature illustrated in the figures. It should be understood that, in addition to the orientations shown in the figures, the spatial relation terms are intended to include different orientations of devices in use and operation. For example, if the devices in the figures are turned over, then the element or feature described as "under" or "beneath" or "below" another element or feature would then be oriented as "above" the other element or feature. Therefore, the exemplary terms "under" and "below" may include both orientations of above and below. The device may be otherwise oriented (rotated by 90 degrees or in other orientations) and the spatial descriptions used herein may be interpreted accordingly.

Terms used herein are for the purpose of describing the specific embodiments only and are not intended to be limiting of the disclosure. As used herein, "a/an", "one" and "said/the" in singular forms are also intended to include a plural form unless the context clearly indicates other forms. It should also be understood that the terms "consist" and/or "include" when used in the description, determine the presence of the features, integers, steps, operations, elements and/or components, but do not exclude the presence or addition of one or more other features, integers, steps, operations, elements, components, and/or groups. As used herein, a term "and/or" includes any and all combinations of related listed items.

In a semiconductor device, especially in a partially depleted Silicon-On-Insulator (SOI) structure, since an oxide layer is provided between a top silicon film and a substrate, after the holes in electron-hole pairs generated during collision of a drain area and a body area flow into the body area, redundant holes cannot be released, thereby causing a floating body effect.

In the semiconductor device with a vertical transistor structure, when there are redundant holes in a channel area, the holes cannot be released in an effective way, so that the floating body effect is also generated, thereby affecting the electrical performance of the device.

Based on this, the following technical solutions of the embodiments of the disclosure are provided.

An embodiment of the disclosure provides a method for manufacturing a semiconductor device. With reference to FIG. 1, the method includes the following operations.

In S110, a substrate is provided.

In S120, a plurality of bit lines extending in a first direction are formed on the substrate.

In S130, a first dielectric layer is formed on the plurality of bit lines.

In S140, the first dielectric layer is etched from top to bottom to form a plurality of channel holes in the first dielectric layer, in which the plurality of channel holes expose the plurality of bit lines.

In S150, a channel layer is formed in each of the plurality of channel holes, in which the channel layer includes a first source/drain area, a channel area and a second source/drain area which are arranged from bottom to top, the first source/drain area is electrically connected to a respective one of the plurality of bit lines, and the first source/drain area, the channel area and the second source/drain area have a same conductive type.

In S160, a plurality of word lines extending in a second direction are formed in the first dielectric layer, in which each of the plurality of word lines is arranged around a plurality of channel areas of a plurality of channel layers.

In the embodiments of the disclosure, in the operation that the channel layer is formed, when the channel layer is formed, three portions arranged from bottom to top are formed, i.e., the first source/drain area, the channel area and the second source/drain area. The first source/drain area, the channel area and the second source/drain area have a same conductive type, and the first source/drain area is electrically connected to the bit line. In this way, when there are redundant holes in the channel area, the holes may be freely transferred to the first source/drain area via the channel area, and then may be released by the bit line. In addition, the manufacturing method in the embodiments of the disclosure also simplifies the process of forming the first source/drain area, the channel area and the second source/drain area, thereby improving the production efficiency. Therefore, the method for manufacturing the semiconductor device provided in the embodiments of the disclosure can not only improve the floating body effect of the semiconductor device, but also effectively improve the production efficiency.

In order to make the above objectives, features and advantages of the disclosure more apparent and lucid, various embodiments of the disclosure are described in detail below with reference to the accompanying drawings. When the embodiments of the disclosure are described in detail, for the convenience of description, a schematic diagram may be partially enlarged not according to a general scale, and the schematic diagram is only an example, and should not limit the protection scope of the disclosure herein.

FIG. 2 to FIG. 13 are process flow diagrams of a semiconductor device according to embodiments of the disclosure during manufacturing. FIG. 14 is a schematic cross-sectional diagram of one of capacitor structures according to an embodiment of the disclosure.

Figure 2:
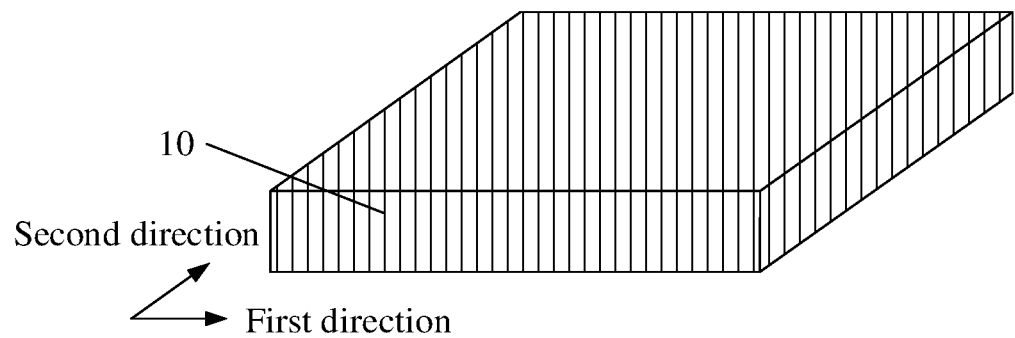
FIG. 2 is a first process flow diagram of a semiconductor device according to an embodiment of the disclosure during manufacturing.

Firstly, S110 is performed, as shown in FIG. 2, in which a substrate 10 is provided.

The substrate may be a semiconductor substrate, and specifically contains at least one elementary semiconductor material (for example, a silicon (Si) substrate, a germanium (Ge) substrate), at least one III-V compound semiconductor material (for example, a gallium nitride (GaN) substrate, a gallium arsenide (GaAs) substrate, an indium phosphide (InP) substrate), at least one II-VI compound semiconductor material, at least one organic semiconductor material, or other semiconductor materials known in the art. In a specific embodiment, the substrate is a silicon substrate.

Figure 3:
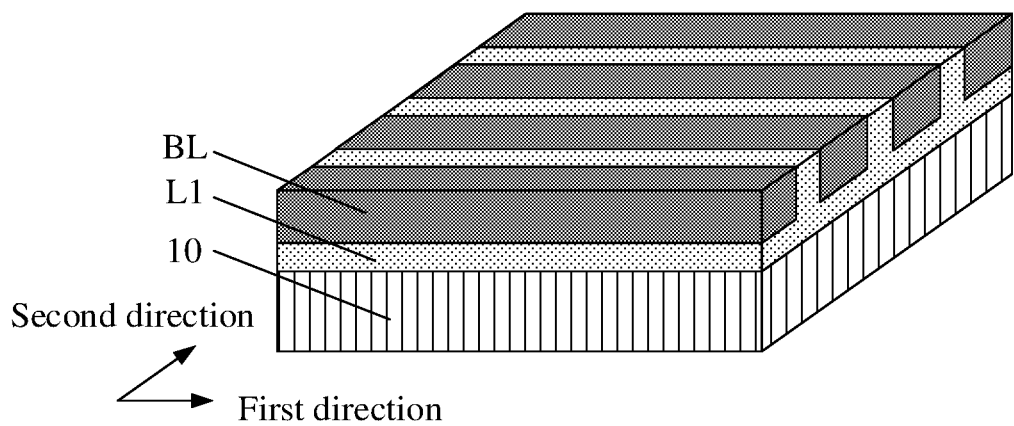
FIG. 3 is a second process flow diagram of a semiconductor device according to an embodiment of the disclosure during manufacturing.

Next, S120 is performed, as shown in FIG. 3, in which a plurality of bit lines BL extending in a first direction are formed on the substrate 10.

In some embodiments, before the bit lines BL are formed on the substrate 10, the method further includes the following operation. An insulating layer L1 is formed on the substrate 10. A material of the insulating layer L1 may include, but is not limited to, oxide, nitride, oxynitride, etc.

In some embodiments, the operation that the plurality of bit lines BL are formed includes the following operations.

A plurality of shallow trenches (not shown in the figures) extending in the first direction are formed on the insulating layer L1.

Each of the plurality of shallow trenches (not shown in the figures) is filled with a conductive layer.

Planarization is performed on the conductive layer to form each of the plurality of bit lines BL.

Optionally, a material of the bit line BL includes, but is not limited to, one or more of tungsten, titanium, cobalt, or polycrystalline silicon.

Figure 4:
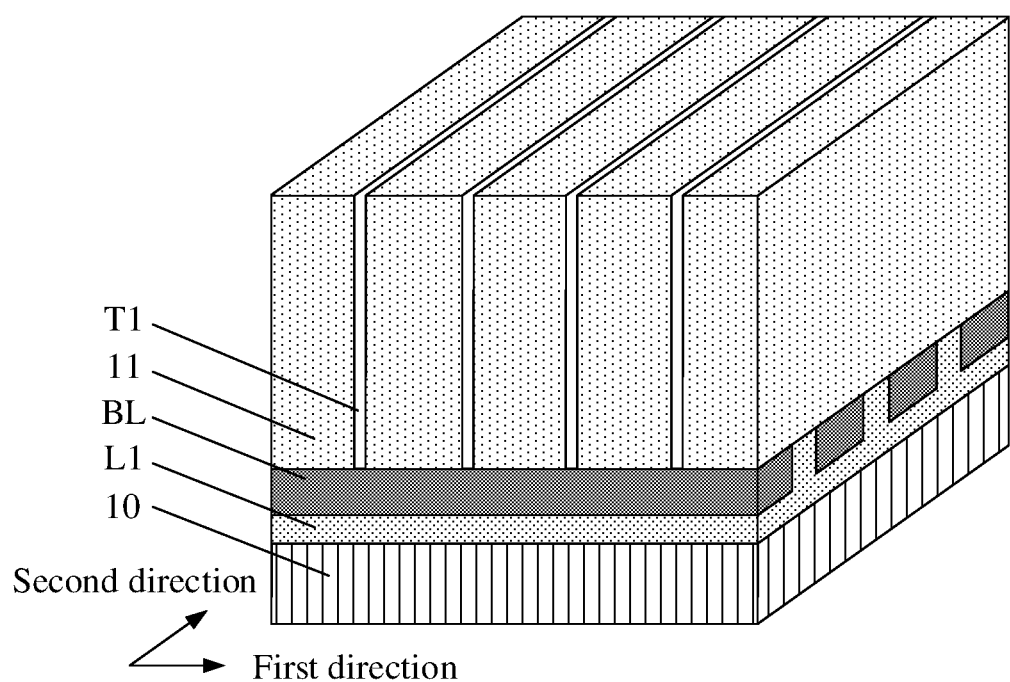
FIG. 4 is a third process flow diagram of a semiconductor device according to an embodiment of the disclosure during manufacturing.

Next, S130 is performed, as shown in FIG. 4, in which a first dielectric layer 11 is formed on the plurality of bit lines BL.

Here, a material of the first dielectric layer 11 may be the same as the material of the insulating layer L1. In some specific embodiments, the material of the first dielectric layer 11 may be silicon nitride.

Figure 6:
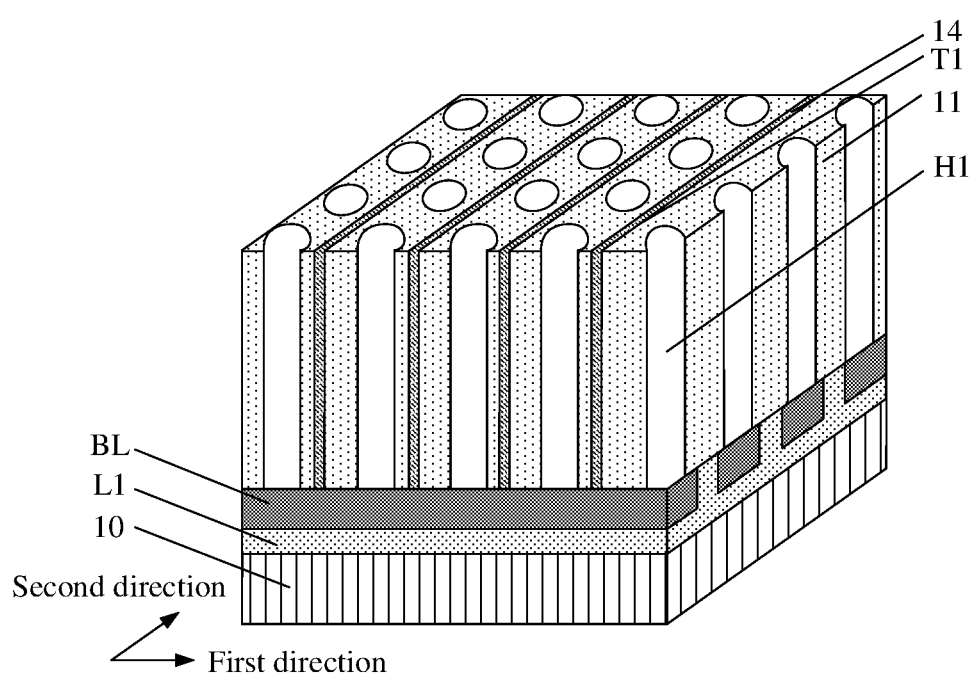
FIG. 6 is a fifth process flow diagram of a semiconductor device according to an embodiment of the disclosure during manufacturing.

Next, S140 is performed, as shown in FIG. 6, in which the first dielectric layer 11 is etched from top to bottom, so as to form a plurality of channel holes H1 in the first dielectric layer 11. The plurality of channel holes H1 expose the plurality of bit lines BL.

Figure 5:
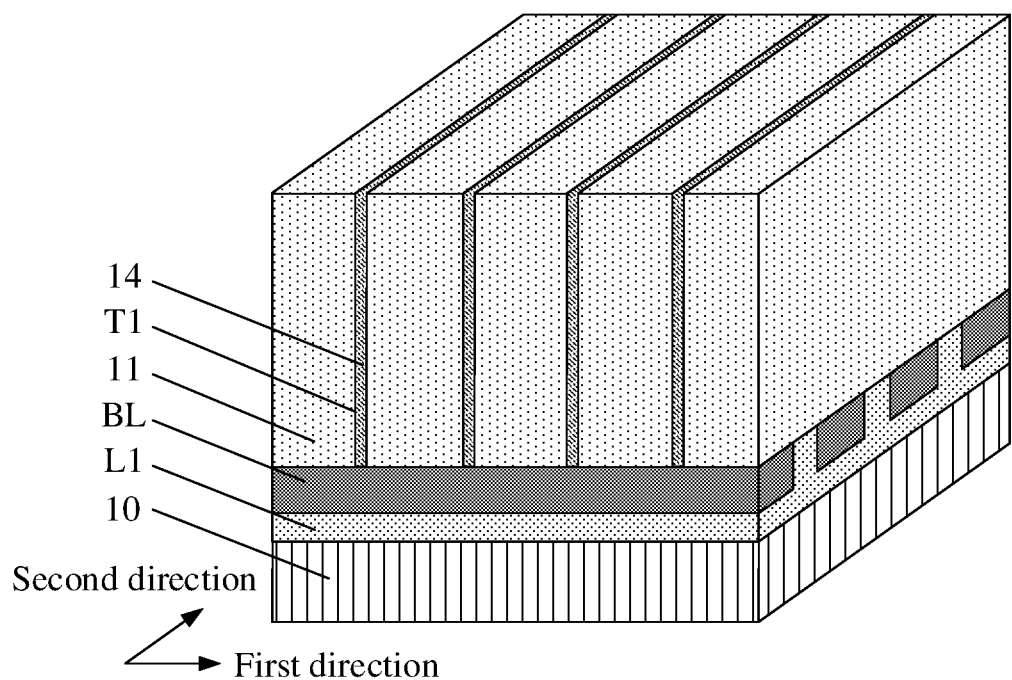
FIG. 5 is a fourth process flow diagram of a semiconductor device according to an embodiment of the disclosure during manufacturing.

In some embodiments, as shown in FIG. 6, the semiconductor device further includes a plurality of word line isolation structures 14 extending in a second direction. In this embodiment, before the plurality of channel holes H1 are formed in the first dielectric layer 11, as shown in FIG. 4 and FIG. 5, the method further includes the following operations.

The first dielectric layer 11 is etched to form a plurality of first trenches T1 extending in the second direction. The plurality of first trenches T1 are arrayed in the first direction.

The plurality of first trenches T1 are filled to form the plurality of word line isolation structures 14 in the first dielectric layer.

Here, a material of the word line isolation structure 14 includes, but is not limited to, silicon oxide, silicon nitride, etc.

In the actual process, the channel holes H1 and the first trenches T1 may be formed through a conventional dry etching process or wet etching process, which is not repeated herein.

Figure 8:
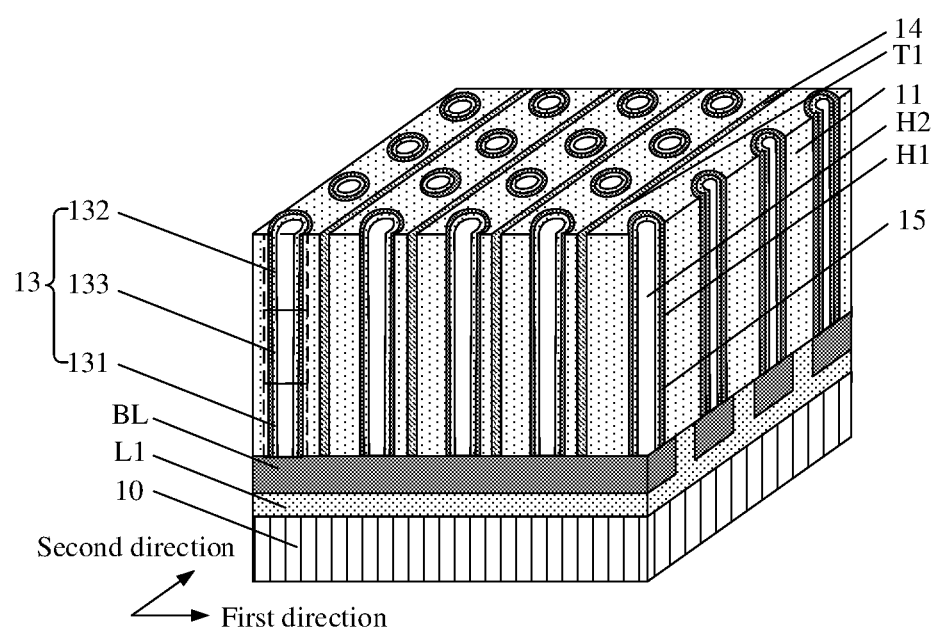
FIG. 8 is a seventh process flow diagram of a semiconductor device according to an embodiment of the disclosure during manufacturing.

Next, S150 is performed, as shown in FIG. 8, in which a channel layer 13 is formed in each of the plurality of channel holes H1. The channel layer 13 includes a first source/drain area 131, a channel area 133 and a second source/drain area 132 which are arranged from bottom to top. The first source/drain area 131 is electrically connected to a respective one of the plurality of bit lines BL. The first source/drain area 131, the channel area 133 and the second source/drain area 132 have a same conductive type.

In this embodiment, in the operation that the channel layer 13 is formed, when the channel layer 13 is formed, three portions arranged from bottom to top are formed, i.e., the first source/drain area 131, the channel area 133 and the second source/drain area 132. The first source/drain area, the channel area and the second source/drain area have a same conductive type, and the first source/drain area 131 is electrically connected to the bit line BL.

Therefore, when there are redundant holes, which easily cause the floating body effect, in the channel area 133, since the channel area 133 and the first source/drain area 131 have the same conductive type, the redundant holes can be released via a path from the channel area 133 to the first source/drain area 131 and then to the bit line BL, thereby preventing the floating body effect from generating in the semiconductor device.

Meanwhile, this operation also simplifies the process of forming the first source/drain area 131, the channel area 133 and the second source/drain area 132, which can effectively improve the production efficiency.

In some embodiments, a material of the channel layer 13 includes an oxide semiconductor material.

Specifically, the oxide semiconductor material includes at least one of indium oxide, tin oxide, In—Zn oxides, Sn—Zn oxides, Al—Zn oxides, In—Ga oxides, In—Ga—Zn oxides, In—Al—Zn oxides, In—Sn—Zn oxides, Sn—Ga—Zn oxides, Al—Ga—Zn oxides, or Sn—Al—Zn oxides.

However, the oxide semiconductor material is not limited thereto. The oxide semiconductor material may further include In—Hf—Zn oxides, In—La—Zn oxides, In—Ce—Zn oxides, In—Pr—Zn oxides, In—Nd—Zn oxides, In—Sm—Zn oxides, In—Eu—Zn oxides, In—Gd—Zn oxides, In—Tb—Zn oxides, In—Dy—Zn oxides, In—Ho—Zn oxides, In—Er—Zn oxides, In—Tm—Zn oxides, In—Yb—Zn oxides, In—Lu—Zn oxides, and quaternary metal oxides, such as In—Sn—Ga—Zn oxides, In—Hf—Ga—Zn oxides, In—Al—Ga—Zn oxides, In—Sn—Al—Zn oxides, In—Sn—Hf—Zn oxides, In—Hf—Al—Zn oxides, etc.

In some embodiments, as the oxide semiconductor material, a material at least including indium (In) or zinc (Zn) may be selected, in particular a material preferably including In and Zn. In addition to the above elements, a material further including gallium (Ga) element as a stabilizer may be selected. The stabilizer may reduce the deviation in electrical characteristics of a transistor finally formed.

Optionally, the oxide semiconductor material includes, but is not limited to, indium gallium zinc oxide (IGZO), for example, a material of which chemical formula is $InGaZnO_4$.

In some embodiments, a ratio among indium (In), gallium (Ga), and zinc (Zn) may be 1:1:1 or 2:2:1. However, the ratio is not limited thereto. The ratio among In, Ga, and Zn may be other appropriate ratios.

Optionally, the oxide semiconductor material may be an undoped oxide semiconductor material, or may be a doped oxide semiconductor material. Specifically, a dopant used for doping the oxide semiconductor material includes more than one of boron, nitrogen, phosphorus and arsenic, or more than one of helium, neon, argon, krypton, and xenon. Alternatively, the dopant is hydrogen. However, the dopant is not limited thereto. The dopant may also be used in combination with the above materials as required.

The oxide semiconductor material may be formed through a sputtering process, a coating process, a printing process, a vapor deposition process, a Plasma Chemical Vapor Deposition (PCVD) process, a Pulsed Laser Deposition (PLD) process, an Atomic Layer Deposition (ALD) process, or a Molecular Beam Epitaxy (MBE) process.

It can be understood that, in a case that the oxide semiconductor material is IGZO, the semiconductor device has the advantages of fast access speed, low cut-off current, and low power consumption.

Figure 7:
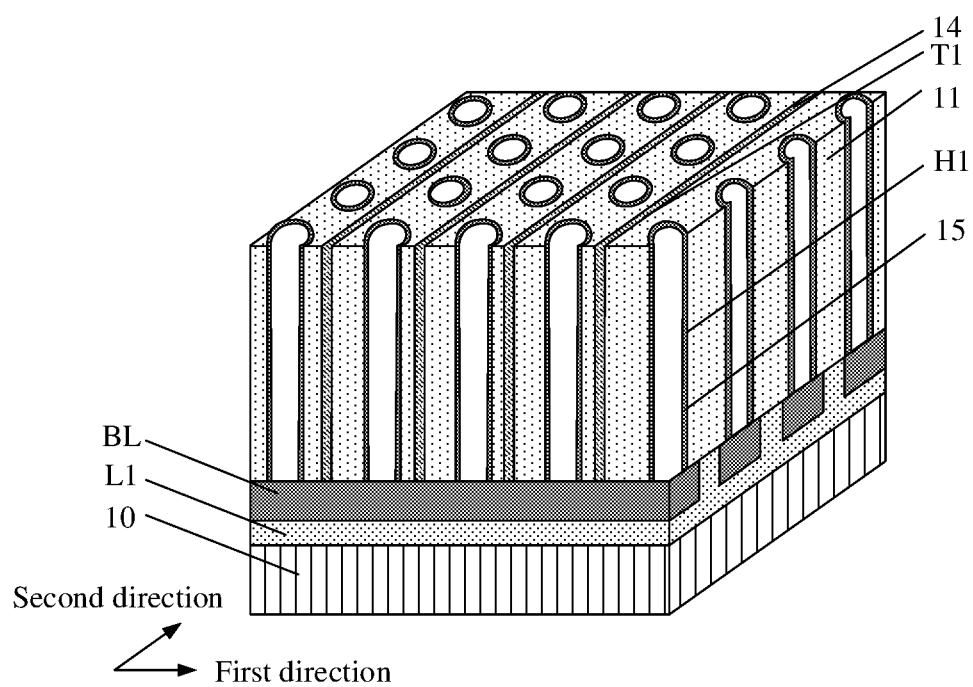
FIG. 7 is a sixth process flow diagram of a semiconductor device according to an embodiment of the disclosure during manufacturing.

In the actual process, as shown in FIG. 7, before the channel layer 13 is formed, the method further includes the following operation. A gate dielectric layer 15 is formed in each of the plurality of channel holes H1. The gate dielectric layer 15 covers a sidewall of each of the plurality of channel holes H1.

Here, the gate dielectric layer 15 includes, but is not limited to, an oxide layer formed through an atomic layer deposition process. In other embodiments, the gate dielectric layer 15 contains, but is not limited to, a high-K dielectric material.

As shown in FIG. 8, the channel layer 13 covers the gate dielectric layer 15. Each of the plurality of channel holes H1 is provided with a cavity H2 in which the gate dielectric layer 15 and the channel layer 13 are absent.

Figure 9:
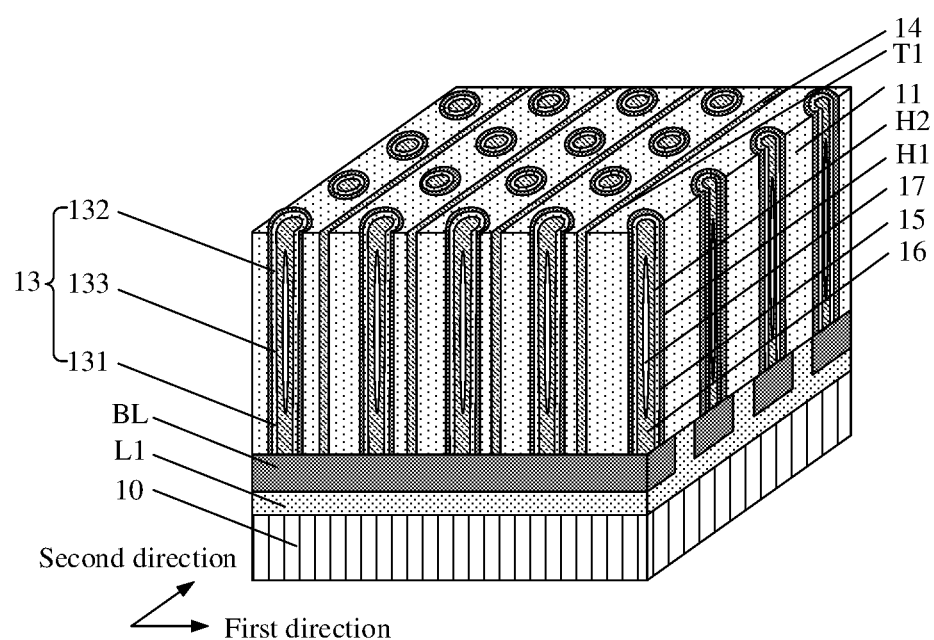
FIG. 9 is an eighth process flow diagram of a semiconductor device according to an embodiment of the disclosure during manufacturing.

After the channel layer 13 is formed in each of the plurality of channel holes H1, the method further includes the following operation. A filling layer 16 is formed in the cavity H2. The filling layer 16 is provided with a void 17, as shown in FIG. 9.

Optionally, a material of the filling layer 16 includes, but is not limited to, silicon nitride.

Figure 10:
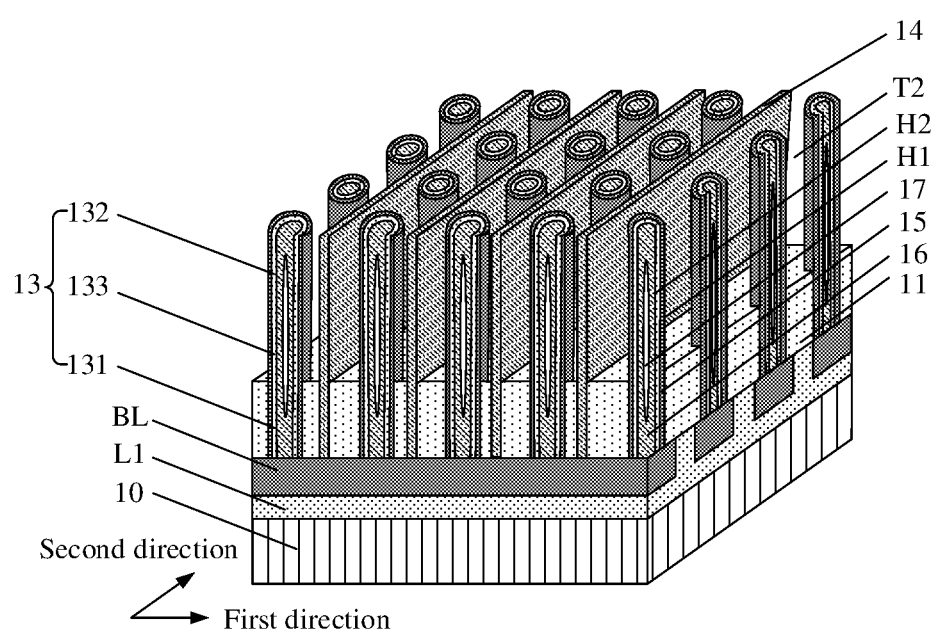
FIG. 10 is a ninth process flow diagram of a semiconductor device according to an embodiment of the disclosure during manufacturing.
Figure 11:
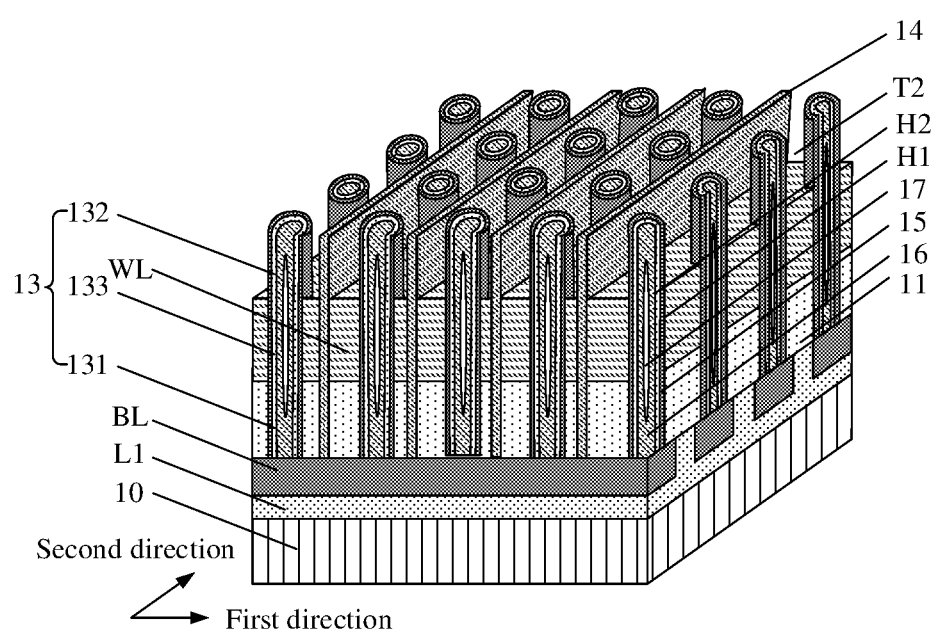
FIG. 11 is a tenth process flow diagram of a semiconductor device according to an embodiment of the disclosure during manufacturing.

Finally, S160 is performed, as shown in FIG. 10 and FIG. 11, in which a plurality of word lines WL extending in a second direction are formed in the first dielectric layer 11. Each of the plurality of word lines WL is arranged around a plurality of channel areas 133 of a plurality of channel layers 13.

Specifically, as shown in FIG. 10 and FIG. 11, the operation that the plurality of word lines extending in the second direction are formed in the first dielectric layer includes the following operations.

The first dielectric layer 11 is etched back, so as to form, between any two adjacent word line isolation structures 14 of the plurality of word line isolation structures, a plurality of second trenches T2 extending in the second direction. A bottom surface of each of the plurality of second trenches T2 is coplanar with an upper surface of the first source/drain area 131.

The plurality of word lines WL are formed in the plurality of second trenches T2. Each of the plurality of word lines WL is arranged around the plurality of channel areas 133 of the plurality of channel layers 13.

Here, as shown in FIG. 11, the operation that the plurality of word lines WL are formed in the plurality of second trenches T2 includes the following operations.

A plurality of word line material layers are formed in the plurality of second trenches T2.

The plurality of word line material layers are etched to form the plurality of word lines WL. The plurality of word lines WL extend in the second direction, and each of the plurality of word lines WL is arranged around the plurality of channel areas 133.

In the actual process, a material of the word line WL may include, but is not limited to, tungsten, titanium nitride, etc.

Figure 12:
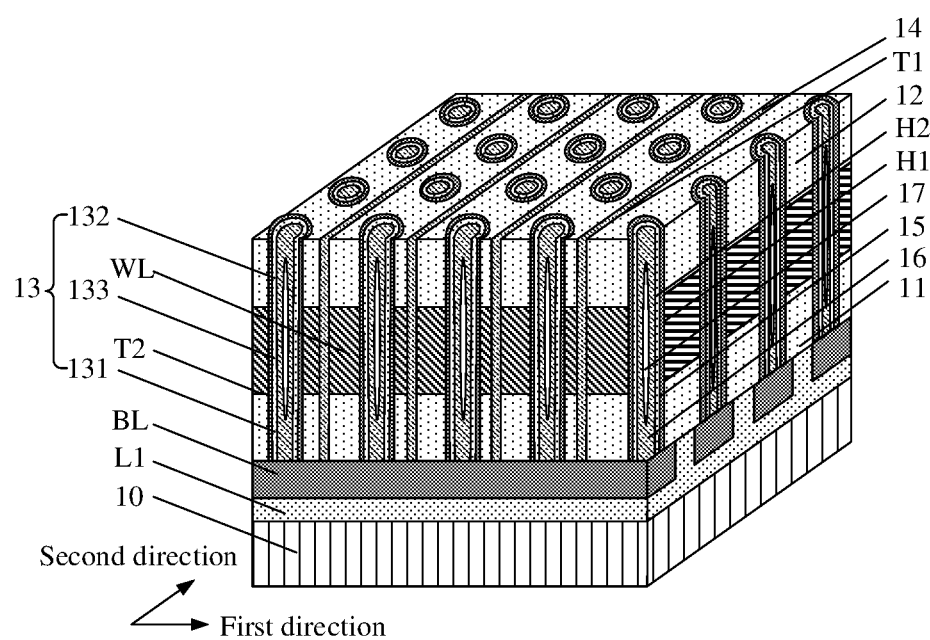
FIG. 12 is an eleventh process flow diagram of a semiconductor device according to an embodiment of the disclosure during manufacturing.

In some embodiments, after the plurality of word lines WL are formed, the method further includes the following operation. A second dielectric layer 12 is formed in each of the plurality of second trenches T2. The second dielectric layer 12 covers the plurality of word lines WL, as shown in FIG. 12.

Specifically, the operation that the second dielectric layer 12 is formed includes the following operations.

A second dielectric material layer is formed in each of the plurality of second trenches T2.

The second dielectric material layer is etched back to form the second dielectric layer 12.

A material of the second dielectric layer 12 may include, but is not limited to, oxide, nitride, oxynitride, etc. In some specific embodiments, the material of the second dielectric layer 12 may be oxide.

Figure 13:
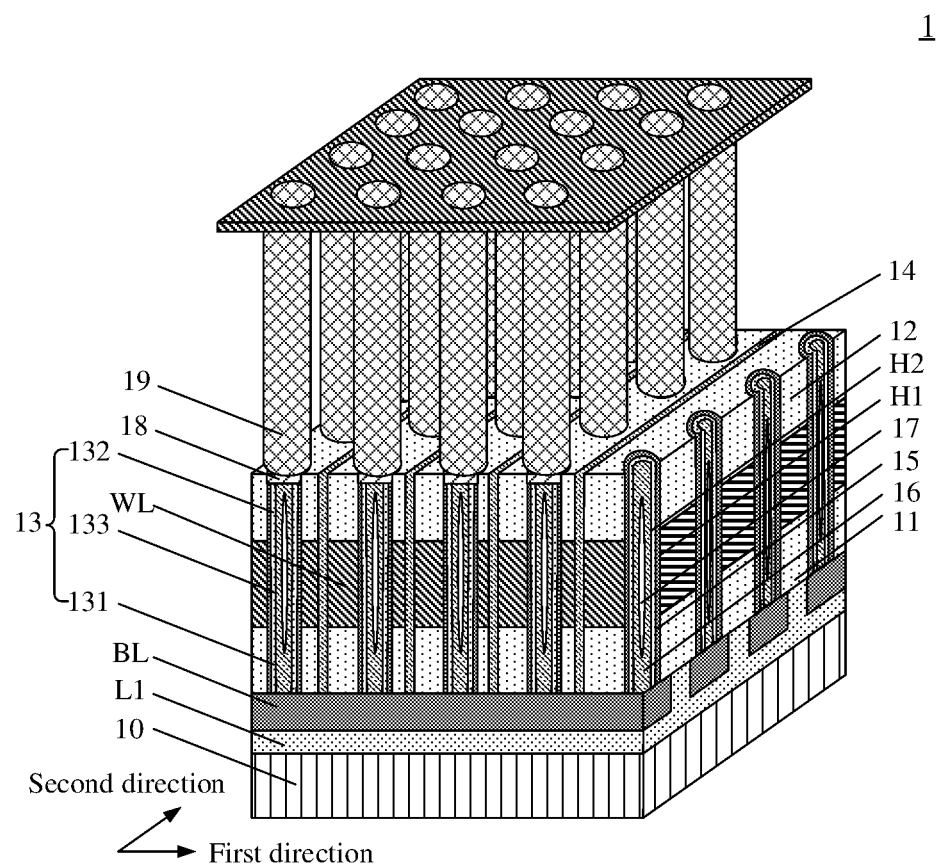
FIG. 13 is a twelfth process flow diagram of a semiconductor device according to an embodiment of the disclosure during manufacturing.
Figure 14:
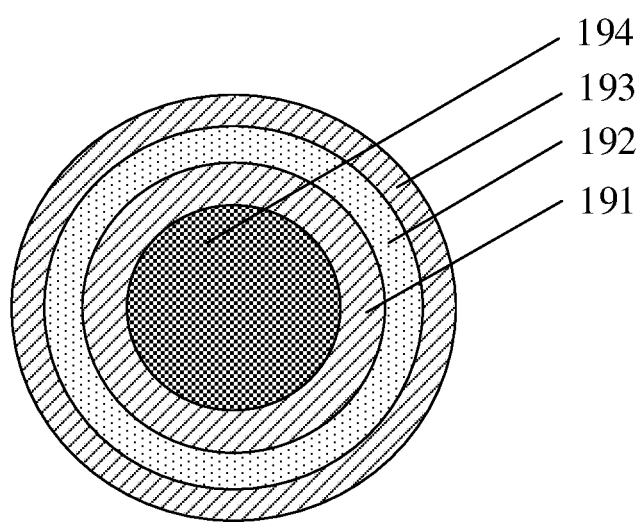
FIG. 14 is a schematic cross-sectional diagram of one of capacitor structures according to an embodiment of the disclosure.

In some embodiments, as shown in FIG. 13, the semiconductor device further includes a capacitor structure 19 for information storage. The method further includes the following operation. A capacitor structure 19 is formed on each of the plurality of channel layers 13. The capacitor structure 19 is electrically connected to the second source/drain area 132.

As shown in FIG. 14, the capacitor structure 19 includes a lower electrode 191, a dielectric material 192, and an upper electrode 193. Materials of the lower electrode 191 and the upper electrode 193 may include one or more conductive materials, such as a doped semiconductor, conductive metal nitride, metal, metal silicide, conductive oxide, or a combination thereof, for example, titanium nitride, tungsten, tantalum nitride, etc.

It can be understood that, the material of the lower electrode 191 may be the same as or different from the material of the upper electrode 193. A material of the dielectric material 192 includes, but is not limited to, nitride, oxide, metal oxide, or a combination thereof, for example, silicon nitride, silicon oxide, etc. In some embodiments, the high-K dielectric material may be used to improve the performance of the capacitor structure 19.

In some specific embodiments, the capacitor structure 19 may further include a conductive pillar 194. A material of the conductive pillar 194 includes, but is not limited to, a silicon germanium layer, etc.

As shown in FIG. 13, in some embodiments, the semiconductor device further includes a node contact plug 18. The node contact plug 18 is configured to form an electric connection between the capacitor structure 19 and the second source/drain area 132. A material of the node contact plug 18 includes, but is not limited to, titanium nitride, tungsten, etc.

It can be understood that, in the embodiments of the disclosure, in a case that the material of the channel layer is IGZO in the oxide semiconductor material, the capacitor structure has the advantages of a reduced refresh rate and longer data retention time, so that the usage requirements can be met by using the capacitor structure with lower capacitance.

Overall, in the embodiments of the disclosure, the channel layer includes three function areas, which respectively are the first source/drain area, the channel area and the second source/drain area which are arranged from bottom to top. When the channel layer is formed, the first source/drain area, the channel area and the second source/drain area are formed. The first source/drain area, the channel area and the second source/drain area have a same conductive type, and the first source/drain area is electrically connected to the bit line. When there are redundant holes in the channel area, the redundant holes may flow to the first source/drain area and then may be released by the bit line, thereby preventing the floating body effect from occurring. In addition, the production process of forming the first source/drain area, the channel area and the second source/drain area is also simplified, thereby improving the production efficiency.

An embodiment of the disclosure further provides a semiconductor device 1. As shown in FIG. 13, the semiconductor device includes:

a substrate 10;

a plurality of bit lines BL arranged on the substrate 10 and extending in a first direction;

a first dielectric layer 11 arranged on the plurality of bit lines BL, in which the first dielectric layer 11 is provided with a plurality of channel holes H1, and the plurality of channel holes H1 expose the plurality of bit lines BL;

a plurality of channel layers 13, in which each of the plurality of channel layers is arranged in a respective one of the plurality of channel holes H1, and includes a first source/drain area 131, a channel area 133 and a second source/drain area 132 which are arranged from bottom to top, the first source/drain area 131 is electrically connected to a respective one of the plurality of bit lines BL, and the first source/drain area 131, the channel area 133 and the second source/drain area 132 have a same conductive type; and a plurality of word lines WL arranged in the first dielectric layer 11, in which the plurality of word lines WL extend in a second direction, and each of the plurality of word lines WL is arranged around a plurality of channel areas 133 of the plurality of channel layers 13.

In some embodiments, the substrate 10 may be a silicon substrate.

As shown in FIG. 13, an insulating layer L1 is also provided between the substrate 10 and the plurality of bit lines BL. The insulating layer L1 may provide the electrical isolation effect between the adjacent bit lines BL. Here, the material of the bit line BL may include, but is not limited to, tungsten, etc. A material of the insulating layer L1 may include, but is not limited to, oxide, nitride, oxynitride, etc.

Optionally, the channel holes H1 may be formed through a conventional dry etching process or wet etching process, which is not repeated herein.

In the actual process, the material of the first dielectric layer 11 may be the same as the material of the insulating layer L1. In some specific embodiments, the material of the first dielectric layer 11 may be silicon nitride.

In some embodiments, a material of the channel layer 13 includes an oxide semiconductor material.

It can be understood that, the oxide semiconductor material includes at least one of indium oxide, tin oxide, In—Zn oxides, Sn—Zn oxides, Al—Zn oxides, In—Ga oxides, In—Ga—Zn oxides, In—Al—Zn oxides, In—Sn—Zn oxides, Sn—Ga—Zn oxides, Al—Ga—Zn oxides, or Sn—Al—Zn oxides.

However, the oxide semiconductor material is not limited thereto. The oxide semiconductor material may further include In—Hf—Zn oxides, In—La—Zn oxides, In—Ce—Zn oxides, In—Pr—Zn oxides, In—Nd—Zn oxides, In—Sm—Zn oxides, In—Eu—Zn oxides, In—Gd—Zn oxides, In—Tb—Zn oxides, In—Dy—Zn oxides, In—Ho—Zn oxides, In—Er—Zn oxides, In—Tm—Zn oxides, In—Yb—Zn oxides, In—Lu—Zn oxides, and quaternary metal oxides, such as In—Sn—Ga—Zn oxides, In—Hf—Ga—Zn oxides, In—Al—Ga—Zn oxides, In—Sn—Al—Zn oxides, In—Sn—Hf—Zn oxides, In—Hf—Al—Zn oxides, etc.

In some embodiments, as the oxide semiconductor material, a material at least including indium (In) or zinc (Zn) may be selected, in particular a material preferably including In and Zn. In addition to the above elements, a material further including gallium (Ga) element as a stabilizer may be selected. The stabilizer may reduce the deviation in electrical characteristics of a transistor finally formed.

Optionally, the oxide semiconductor material includes, but is not limited to, indium gallium zinc oxide (IGZO), for example, a material of which chemical formula is $InGaZnO_4$.

In some embodiments, a ratio among indium (In), gallium (Ga), and zinc (Zn) may be 1:1:1 or 2:2:1. However, the ratio is not limited thereto. The ratio among In, Ga, and Zn may be other appropriate ratios.

Optionally, the oxide semiconductor material may be an undoped oxide semiconductor material, or may be a doped oxide semiconductor material. Specifically, a dopant used for doping the oxide semiconductor material includes more than one of boron, nitrogen, phosphorus and arsenic, or more than one of helium, neon, argon, krypton, and xenon. Alternatively, the dopant is hydrogen. However, the dopant is not limited thereto. The dopant may also be used in combination with the above materials as required.

The oxide semiconductor material may be formed through a sputtering process, a coating process, a printing process, a vapor deposition process, a PCVD process, a PLD process, an ALD process, or a MBE process.

It can be understood that, in a case that the oxide semiconductor material is IGZO, the semiconductor device has the advantages of fast access speed, low cut-off current, and low power consumption.

In the embodiments of the disclosure, the channel layer includes three function areas, which respectively are the first source/drain area, the channel area and the second source/drain area which are arranged from bottom to top. The first source/drain area, the channel area and the second source/drain area have a same conductive type, and the first source/drain area is electrically connected to the bit line. When there are redundant holes in the channel area, the redundant holes may flow to the first source/drain area and then may be released by the bit line, thereby preventing the floating body effect from occurring.

With reference to FIG. 13, it can be seen that, the semiconductor device 1 further includes a gate dielectric layer 15. The gate dielectric layer 15 is arranged between the channel hole H1 and the channel layer 13.

The gate dielectric layer 15 may provide the electrical insulation effect between the channel layer 13 and the word line WL. Here, the gate dielectric layer 15 may be an oxide layer formed through an atomic layer deposition process.

In some embodiments, each of the plurality of channel holes H1 is provided with a cavity H2 in which the gate dielectric layer 15 and the channel layer 13 are absent.

The semiconductor device further includes a filling layer 16 arranged in the cavity H2. The filling layer 16 is provided with a void 17.

Optionally, a material of the filling layer 16 includes, but is not limited to, silicon nitride, etc.

It can be seen from FIG. 13 that, the semiconductor device 1 further includes a plurality of word line isolation structures 14 extending in the second direction. The word line isolation structure 14 is arranged between any two adjacent word lines WL.

In some embodiments, the word line isolation structure 14 is configured to provide the electrical isolation effect between the two adjacent word lines WL. It can be understood that, a bottom surface of the word line WL is coplanar with the upper surface of the first source/drain area 131.

Here, a material of the word line isolation structures 14 includes, but is not limited to, silicon oxide, silicon nitride, etc. The material of the word line WL may include, but is not limited to, tungsten, titanium nitride, etc.

With reference to FIG. 13, it can be seen that, in some specific embodiments, the semiconductor device 1 further includes a capacitor structure 19 for information storage. The capacitor structure 19 is electrically connected to the second source/drain area 132.

As shown in FIG. 14, the capacitor structure 19 includes a lower electrode 191, a dielectric material 192, and an upper electrode 193. Materials of the lower electrode 191 and the upper electrode 193 may include one or more conductive materials, such as a doped semiconductor, conductive metal nitride, metal, metal silicide, conductive oxide, or a combination thereof, for example, titanium nitride, tungsten, tantalum nitride, etc.

In some specific embodiments, the capacitor structure 19 may further include a conductive pillar 194. A material of the conductive pillar 194 includes, but is not limited to, a silicon germanium layer, etc.

In some embodiments, the semiconductor device 1 further includes a node contact plug 18. The node contact plug 18 is configured to form an electric connection between the capacitor structure 19 and the second source/drain area 132. A material of the node contact plug 18 includes, but is not limited to, titanium nitride, tungsten, etc.

It can be understood that, in the embodiments of the disclosure, in a case that the material of the channel layer is IGZO in the oxide semiconductor material, the capacitor structure has the advantages of a reduced refresh rate and longer data retention time, so that the usage requirements can be met by using the capacitor structure with lower capacitance.

Figure 15:
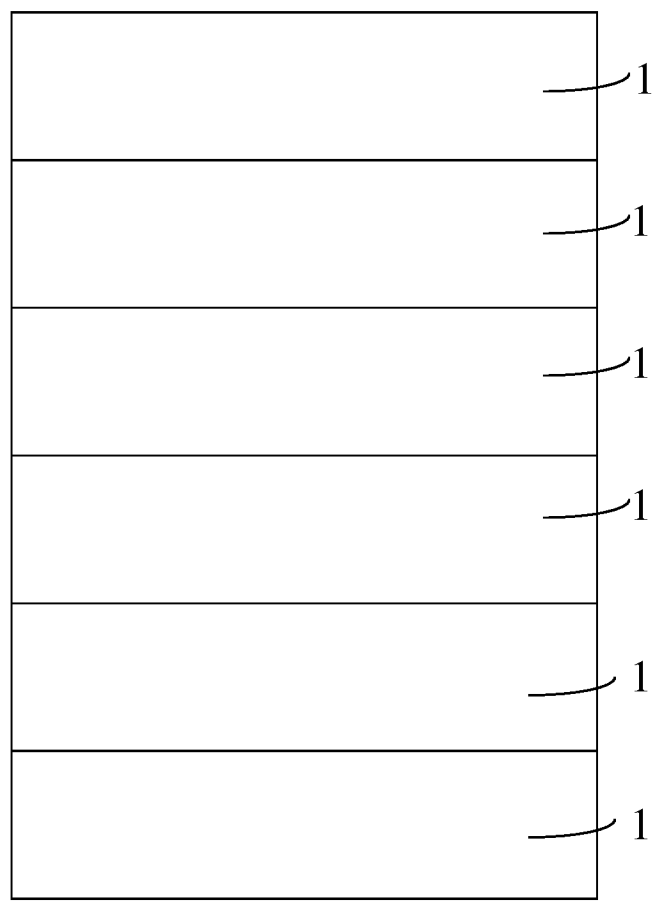
FIG. 15 is a schematic diagram of a stack device according to an embodiment of the disclosure.

An embodiment of the disclosure further provides a stack device. As shown in FIG. 13 and FIG. 15, the stack device includes a substrate, and a plurality of storage structures 1 arranged on the substrate and stacked onto one another.

As shown in FIG. 13, each of the plurality of storage structures 1 includes:
a plurality of bit lines BL extending in a first direction;
a first dielectric layer 11 arranged on the plurality of bit lines BL, in which the first dielectric layer 11 is provided with a plurality of channel holes H1, and the plurality of channel holes H1 expose the plurality of bit lines BL;
a plurality of channel layers 13, in which each of the plurality of channel layers 13 is arranged in a respective one of the plurality of channel holes H1, and includes a first source/drain area 131, a channel area 133 and a second source/drain area 132 which are arranged from bottom to top, the first source/drain area 131 is electrically connected to a respective one of the plurality of bit lines BL, and the first source/drain area 131, the channel area 133 and the second source/drain area 132 have a same conductive type;
a plurality of word lines WL arranged in the first dielectric layer 11, in which the plurality of word lines WL extend in a second direction, and each of the plurality of word lines WL is arranged around a plurality of channel areas 133 of the plurality of channel layers 13; and
a capacitor structure 19 electrically connected to the second source/drain area 132.

In the embodiments of the disclosure, the stack device is formed by stacking the storage structures, so that the integration may be effectively increased. In addition, in a case that the material of the channel layer is IGZO, the stack device has the advantages of fast access speed, low cut-off current, and low power consumption. The capacitor structure in the stack device has the advantages of a reduced refresh rate and longer data retention time, so that the usage requirements can be met by using the capacitor structure with lower capacitance.

It should be noted that, in the embodiments of the disclosure, FIG. 15 only shows the stack device with several layers of the storage structures 1. However, the stack device is not limited thereto. In the actual process, the number of the storage structures 1 in the stack device may be several, dozens, hundreds or even more, which may be flexibly set as required.

Overall, in the embodiments of the disclosure, in the operation that the channel layer is formed, when the channel layer is formed, three portions arranged from bottom to top are formed, i.e., the first source/drain area, the channel area and the second source/drain area. The first source/drain area, the channel area and the second source/drain area have a same conductive type, and the first source/drain area is electrically connected to the bit line. When there are redundant holes in the channel area, the redundant holes may flow to the first source/drain area and then may be released by the bit line, thereby preventing the floating body effect from occurring. Meanwhile, the method in the embodiments of the disclosure can also effectively improve the production efficiency.

It can be understood that, in the embodiments of the disclosure, in a case that the material of the channel layer is IGZO, the semiconductor device has the advantages of fast access speed, low cut-off current, and low power consumption. The capacitor structure has the advantages of a reduced refresh rate and longer data retention time, so that the usage requirements can be met by using the capacitor structure with lower capacitance.

In addition, in the embodiments of the disclosure, the stack device is formed by stacking the storage structures, so that the integration may be effectively increased.

It should be noted that, the method for manufacturing the semiconductor device provided in the embodiments of the disclosure can be applied to the DRAM structure or other semiconductor devices, which is not excessively limited herein. The embodiments of the method for manufacturing the semiconductor device provided in the disclosure and the embodiments of the semiconductor device belong to the same concept. The technical features in the technical solutions described in various embodiments may be arbitrarily combined with each other without conflict.

The embodiments of the disclosure provide a method for manufacturing a semiconductor device, a semiconductor device, and a stack device. The method includes the following operations. A substrate is provided. A plurality of bit lines extending in a first direction are formed on the substrate. A first dielectric layer is formed on the plurality of bit lines. The first dielectric layer is etched from top to bottom to form a plurality of channel holes in the first dielectric layer, in which the plurality of channel holes expose the plurality of bit lines. A channel layer is formed in each of the plurality of channel holes, in which the channel layer includes a first source/drain area, a channel area and a second source/drain area which are arranged from bottom to top, the first source/drain area is electrically connected to a respective one of the plurality of bit lines, and the first source/drain area, the channel area and the second source/drain area have a same conductive type. A plurality of word lines extending in a second direction are formed in the first dielectric layer, in which each of the plurality of word lines is arranged around a plurality of channel areas of a plurality of channel layers. In the operation that the channel layer is formed, when the channel layer is formed, three portions arranged from bottom to top are formed, i.e., the first source/drain area, the channel area and the second source/drain area. The first source/drain area, the channel area and the second source/drain area have a same conductive type, and the first source/drain area is electrically connected to the bit line. In this way, when there are redundant holes in the channel area, the holes may be freely transferred to the first source/drain area via the channel area, and then may be released by the bit line, thereby improving the floating body effect. In addition, the manufacturing method in the embodiments of the disclosure also simplifies the process of forming the first source/drain area, the channel area and the second source/drain area, thereby improving the production efficiency. Therefore, the method for manufacturing the semiconductor device provided in the embodiments of the disclosure can not only improve the floating body effect of the semiconductor device, but also effectively improve the production efficiency.

The above only describes the preferred embodiments of the disclosure, and is not intended to limit the protection scope of the disclosure. Any modifications, equivalent substitution, and improvements made within the spirit and principle of the disclosure shall be contained within the protection scope of the disclosure.

What is claimed is:

1. A method for manufacturing a semiconductor device, comprising:
   providing a substrate;
   forming, on the substrate, a plurality of bit lines extending in a first direction;
   forming a first dielectric layer on the plurality of bit lines;
   etching the first dielectric layer from top to bottom to form a plurality of channel holes in the first dielectric layer, wherein the plurality of channel holes expose the plurality of bit lines;
   forming a channel layer in each of the plurality of channel holes, wherein the channel layer comprises a first source/drain area, a channel area and a second source/drain area which are arranged from bottom to top, the first source/drain area is electrically connected to a respective one of the plurality of bit lines, and the first source/drain area, the channel area and the second source/drain area have a same conductive type; and
   forming, in the first dielectric layer, a plurality of word lines extending in a second direction, wherein each of the plurality of word lines is arranged around a plurality of channel areas of a plurality of channel layers.

2. The method for manufacturing the semiconductor device according to claim 1, wherein a material of the channel layer comprises an oxide semiconductor material.

3. The method for manufacturing the semiconductor device according to claim 1, wherein before forming the channel layer, the method further comprises: forming a gate dielectric layer in each of the plurality of channel holes, wherein the gate dielectric layer covers a sidewall of each of the plurality of channel holes.

4. The method for manufacturing the semiconductor device according to claim 3, wherein the channel layer covers the gate dielectric layer, and each of the plurality of channel holes is provided with a cavity in which the gate dielectric layer and the channel layer are absent; and
   wherein after forming the channel layer in each of the plurality of channel holes, the method further comprises: forming a filling layer in the cavity, wherein the filling layer is provided with a void.

5. The method for manufacturing the semiconductor device according to claim 1, wherein the semiconductor device further comprises a plurality of word line isolation structures extending in the second direction, and wherein before forming the plurality of channel holes in the first dielectric layer, the method further comprises:
- etching the first dielectric layer to form a plurality of first trenches extending in the second direction, wherein the plurality of first trenches are arrayed in the first direction; and
- filling the plurality of first trenches to form the plurality of word line isolation structures in the first dielectric layer.

6. The method for manufacturing the semiconductor device according to claim 5, wherein forming, in the first dielectric layer, the plurality of word lines extending in the second direction comprises:
- etching back the first dielectric layer to form, between any two adjacent word line isolation structures of the plurality of word line isolation structures, a plurality of second trenches extending in the second direction, wherein a bottom surface of each of the plurality of second trenches is coplanar with an upper surface of the first source/drain area; and
- forming the plurality of word lines in the plurality of second trenches, wherein each of the plurality of word lines is arranged around the plurality of channel areas of the plurality of channel layers.

7. The method for manufacturing the semiconductor device according to claim 6, wherein after forming the plurality of word lines, the method further comprises: forming a second dielectric layer in each of the plurality of second trenches, wherein the second dielectric layer covers the plurality of word lines.

8. The method for manufacturing the semiconductor device according to claim 1, further comprising: forming a capacitor structure on each of the plurality of channel layers, wherein the capacitor structure is electrically connected to the second source/drain area.

* * * * *